United States Patent [19]
Takeuchi et al.

[11] Patent Number: 5,942,749
[45] Date of Patent: Aug. 24, 1999

[54] PHOTODETECTOR HAVING MEANS FOR PROCESSING OPTICAL INPUT SIGNALS

[75] Inventors: Hiroshi Takeuchi, Tokyo; Kouichi Shiraishi, Kumamoto, both of Japan

[73] Assignee: NEC Corporation, Tokyo, Japan

[21] Appl. No.: 08/901,629

[22] Filed: Jul. 28, 1997

[30] Foreign Application Priority Data

Jul. 29, 1996 [JP] Japan ................................. 8-198964

[51] Int. Cl.$^6$ ................................................ H01J 40/14
[52] U.S. Cl. ........................... 250/214.1; 250/214 LA; 257/435; 257/461
[58] Field of Search ........................... 250/214.1, 214 R, 250/214 LA, 214 LS; 257/435, 461, 432

[56] References Cited

U.S. PATENT DOCUMENTS 5,773,859  6/1998  Ueno ........................................ 257/435

FOREIGN PATENT DOCUMENTS

| | | |
|---|---|---|
| 61-280079 | 12/1986 | Japan . |
| 63-4777 | 1/1988 | Japan . |
| 3-16477 | 1/1991 | Japan . |
| 3-27683 | 2/1991 | Japan . |
| 4-56274 | 2/1992 | Japan . |
| 4-134982 | 5/1992 | Japan . |
| 5-82767 | 4/1993 | Japan . |
| 5-326907 | 12/1993 | Japan . |
| 7-99301 | 4/1995 | Japan . |

OTHER PUBLICATIONS

H. Khorramabadi, et al., "A 1.06Gb/s–31dBm to 0dBm BiCMOS Optical Preamplifier Adaptive Transimpedance", *Digest of Technical Papers*, IEEE International Solid–State Conference, Feb. 15, 1995, pp. 54–56.

*Primary Examiner*—Que T. Le
*Attorney, Agent, or Firm*—Whitham, Curtis & Whitham

[57] ABSTRACT

A photodetector with a signal processing capability processes optical input signals therein. The photodetector has a first input area and a second input area which are optically isolated from each other, but electrically connected to each other due to crosstalk characteristics to operate as a two-input adder.

17 Claims, 7 Drawing Sheets

PHOTODETECTOR HAVING MEANS FOR PROCESSING OPTICAL INPUT SIGNALS

BACKGROUND OF THE INVENTION

1. Field of the Invention

The present invention relates to a photodetector, and more particularly to a photodetector with a signal processing capability.

2. Description of the Related Art

As shown in FIG. 1 of the accompanying drawings, one conventional adder with a photodetector comprises a pair of photodiodes 401, 402 constructed of n-type epitaxial layers 413, 414 and a p-type substrate 405. and a current-to-voltage (I/V) converter 400 for converting a current signal obtained from optical signals 409, 410 applied respectively to the photodiodes 401, 402 into a voltage signal, the I/V converter 400 comprising an operational amplifier 403, a feedback resistor 411, and an output terminal 404. The photodiodes 401, 402 are electrically insulated from each other by a p-type high-concentration layer 407. and connected to the I/V converter 400 by a metallic interconnection 412 for adding the optical signals.

A conventional photodetector is shown in FIG. 2 of the accompanying drawings. The photodetector shown in FIG. 2 is disclosed in Japanese laid-open patent publication No. 56274/92. The photodetector has a photodiode (photoelectric transducer) comprising a p-type well layer 502 and an n-type impurity layer 503, and electrically separated from other elements by a $p_+$-type impurity layer 505. The photodetector itself has no electric signal processing capability.

FIG. 3 of the accompanying drawings shows a signal processing circuit with a photodetector disclosed in Japanese laid-open patent publication No. 280079/86. As shown in FIG. 3, the signal processing circuit has a four-segment photodiode 601 for producing current signals that are supplied to an FM amplifier 604, an operational amplifier 608, and an operational amplifier 612 which perform a signal processing operation on the supplied signals. The four-segment photodiode 601 itself has no electric signal processing capability.

A conventional applied circuit which incorporates a photodetector is illustrated in FIG. 4 of the accompanying drawings. As shown in FIG. 4, a current signal from a photodiode 701 is converted by an I/V converter 702 into a voltage signal whose voltage gain is adjusted by an automatic gain control (AGC) circuit 703 to produce an optimum voltage signal at an output terminal 802.

FIG. 5 of the accompanying drawings shows a specific circuit arrangement of the AGC 703 shown in FIG. 4. As shown in FIG. 5, the AGC circuit 703 comprises NPN transistors $Q_1$, $Q_2$, $Q_3$, resistors $R_1$, $R_2$, $R_3$, and a current supply $V_{in}$. Collector currents flowing into the NPN transistors $Q_1$, $Q_2$ are adjusted by controlling a control voltage applied between the bases of the NPN transistors $Q_1$, $Q_2$ for thereby controlling the gain of the AGC 703.

If photodiodes are connected as in the four-segment photodiode 601 shown in FIG. 3, then since crosstalk characteristics thereof are responsible for degraded signals, it is desirable to suppress such crosstalk characteristics. According to the crosstalk characteristics, a signal charge generated by light applied to a photodiode in the vicinity of an adjacent photodiode is detected as a signal of the adjacent photodiode due to diffusion and drift.

The structure of a photodiode which is designed to reduce crosstalk characteristics is illustrated in FIG. 6 of the accompanying drawings (see Japanese laid-open patent publication No. 82767/93). As shown in FIG. 6, a $p^+$-type high-concentration layer 918 is disposed between photoelectric transducers 901 for absorbing dripwise holes that are generated by light applied in the vicinity of the photoelectric transducers 901. thereby suppressing crosstalk.

However, the above conventional photodetectors with a signal processing capability have been disadvantageous in that since the photodetector (photodiodes) and the signal processor (circuit) are separate elements, the area and hence cost of the chip required are large.

SUMMARY OF THE INVENTION

It is therefore an object of the present invention to provide a photodetector with a signal processing capability which is relatively small in chip area.

To achieve the above object, there is provided in accordance with the present invention a photodetector having therein at least means for processing optical input signals.

According to the present invention, there is also provided a photodetector having therein at least means for controlling the width of a depletion layer of a pn junction to control an optical carrier.

Since a signal processing capability, which has heretofore been achieved by an external circuit, is performed in the photodetector itself, the chip area of the photodetector is reduced, and the power requirement thereof is also lowered.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 1:
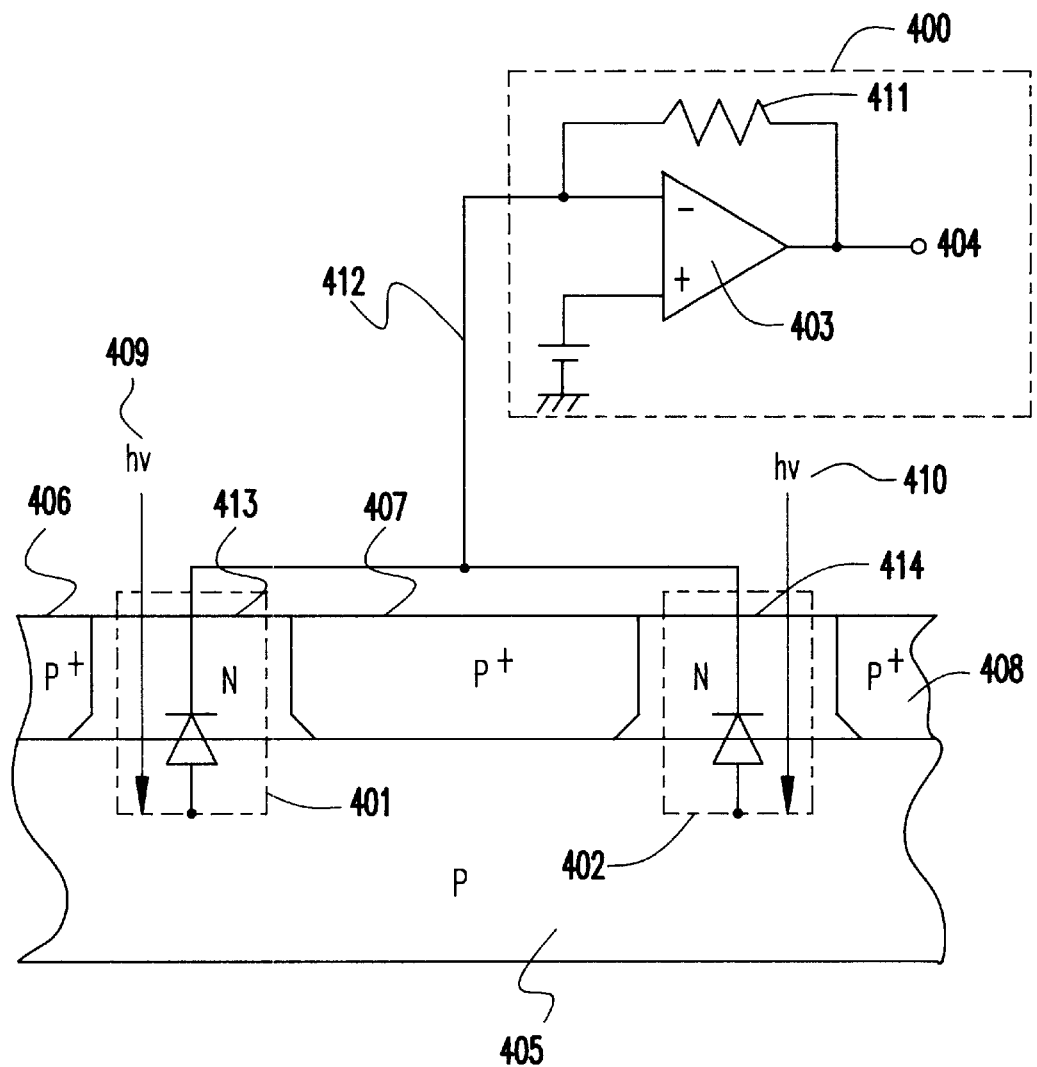
FIG. 1 is a fragmentary cross-sectional view, combined with a circuit diagram, of a conventional adder with a photodetector.
Figure 2:
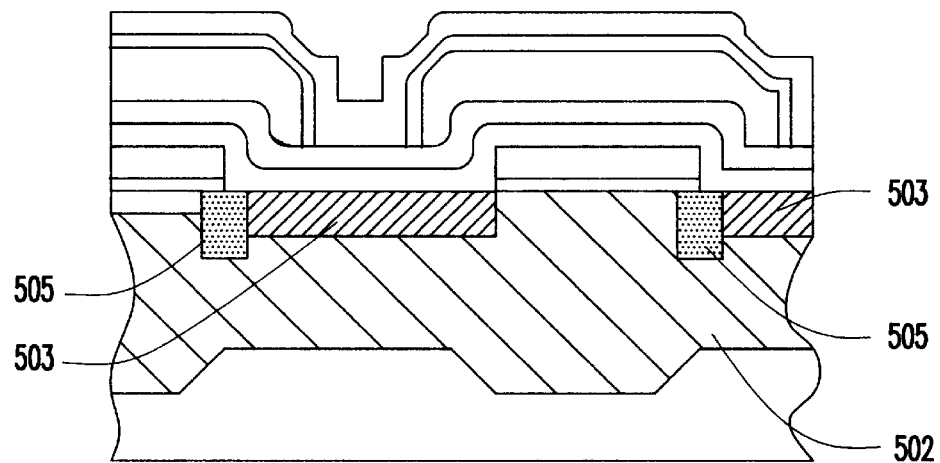
FIG. 2 is a fragmentary cross-sectional view of a conventional photodetector disclosed in Japanese laid-open patent publication No. 56274/92.
Figure 3:
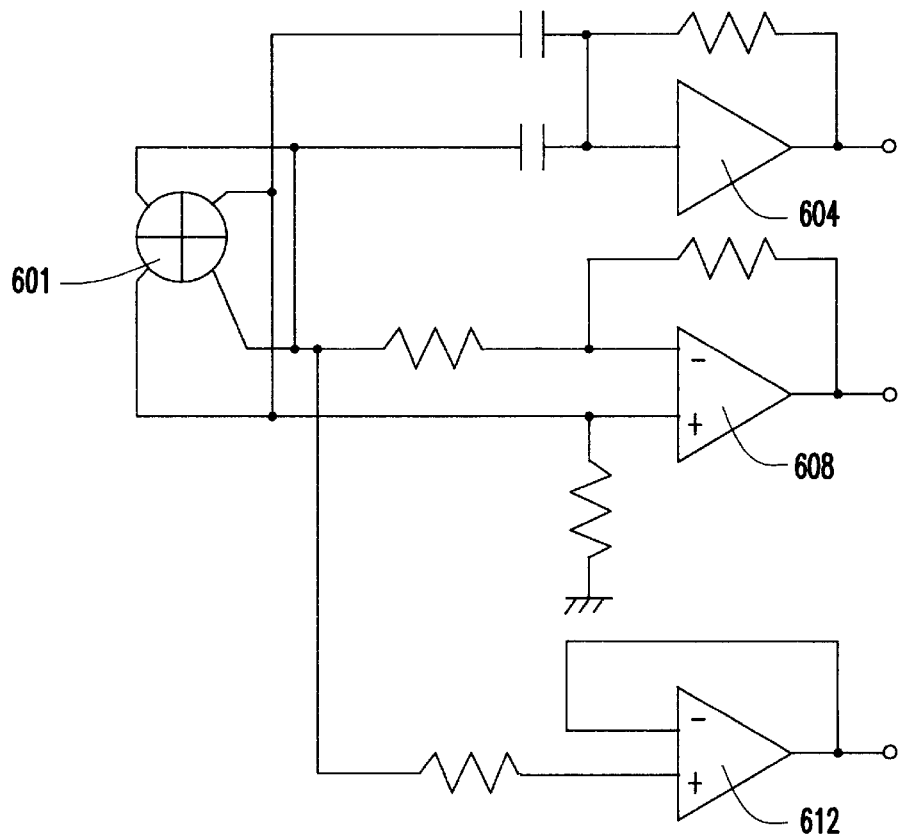
FIG. 3 is a circuit diagram of a signal processing circuit with a photodetector disclosed in Japanese laid-open patent publication No. 280079/86.
Figure 4:
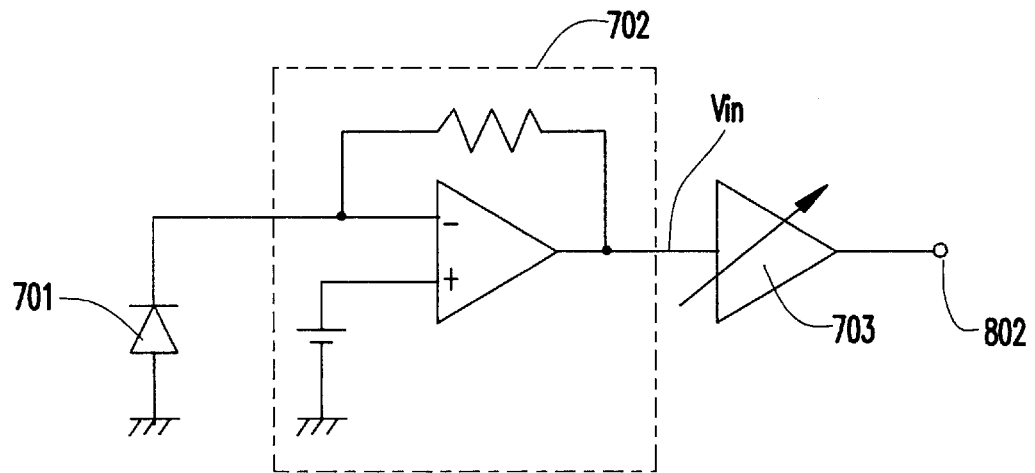
FIG. 4 is a block diagram of a conventional applied circuit which incorporates a photodetector.
Figure 5:
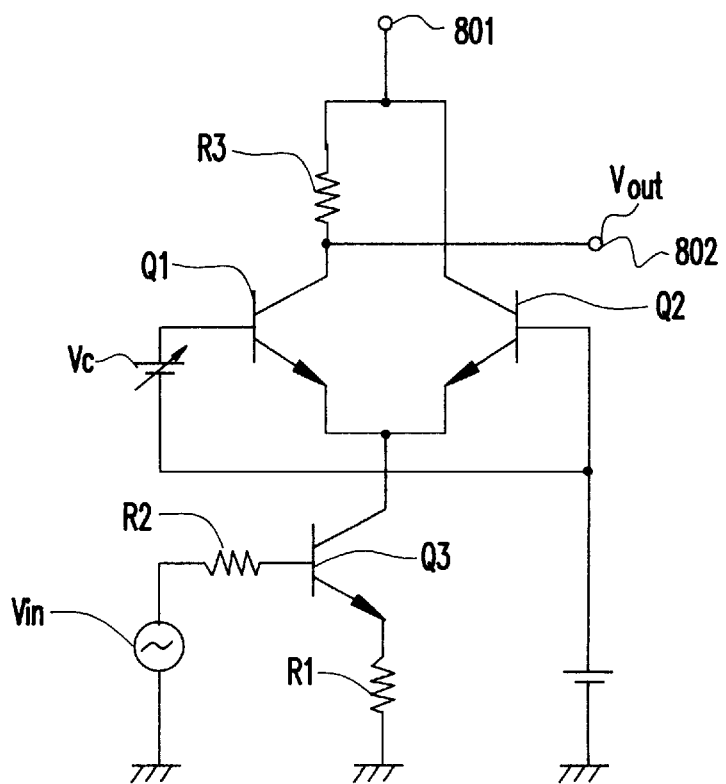
FIG. 5 is a circuit diagram of a conventional AGC circuit in the circuit shown in FIG. 4.
Figure 6:
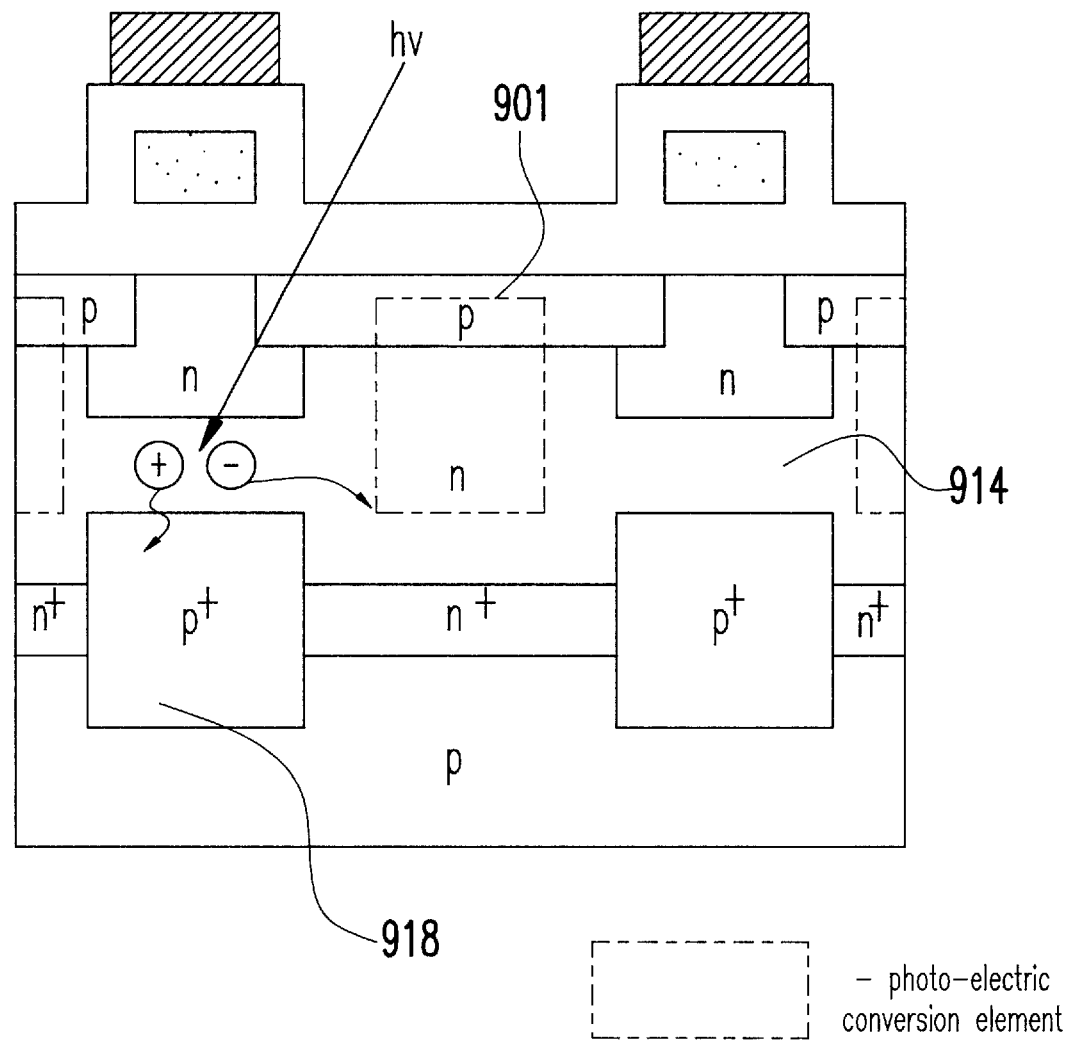
FIG. 6 is a cross-sectional view of a photodiode disclosed in Japanese laid-open patent publication No. 82767/93.
Figure 7:
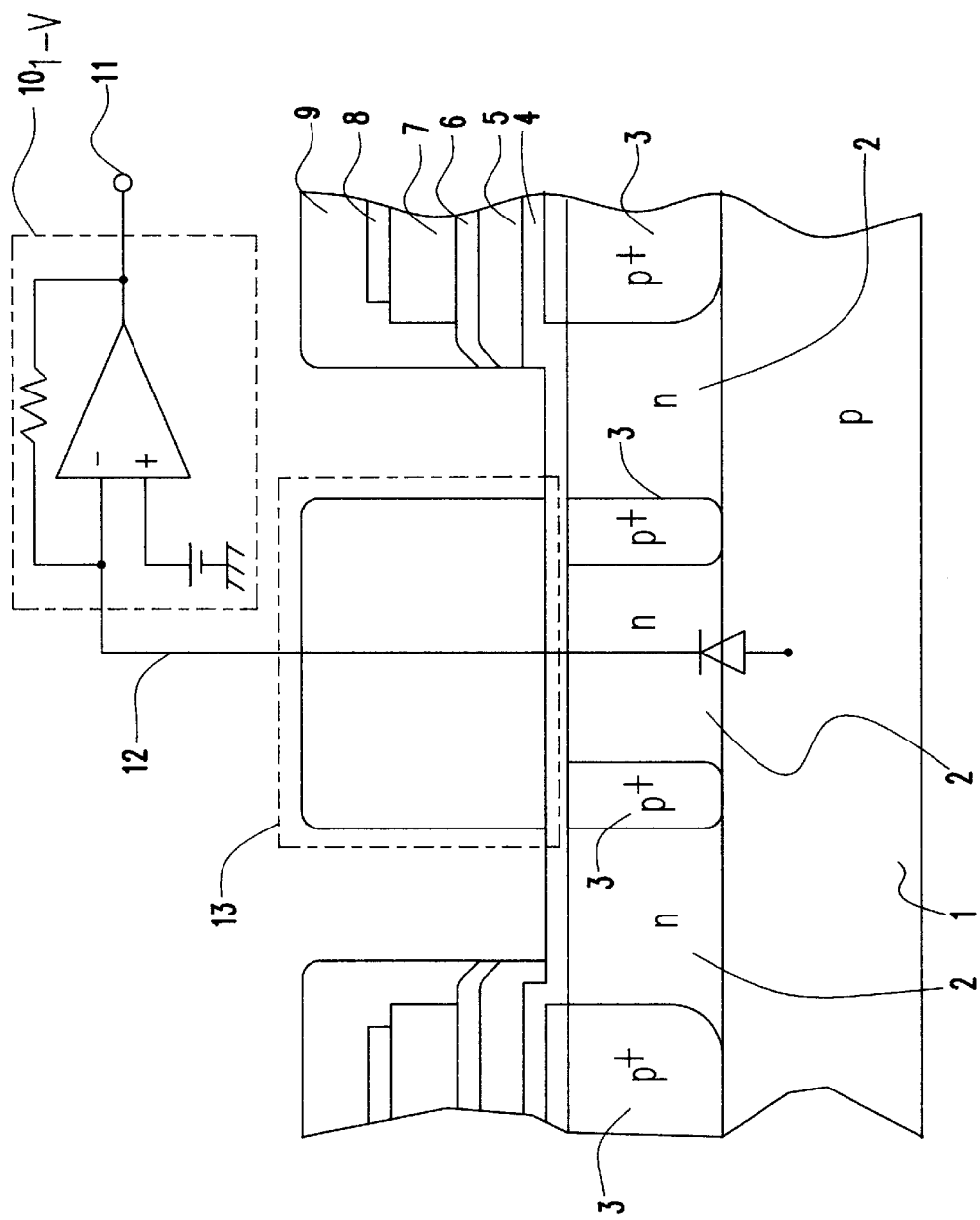
FIG. 7 is a fragmentary cross-sectional view, combined with a circuit diagram, of a photodetector with a signal processing capability according to a first embodiment of the present invention.

FIG. 7 shows a photodetector with a signal processing capability according to a first embodiment of the present invention and an I/V converter coupled thereto. As shown in FIG. 7, the photodetector includes a pn junction comprising a p-type silicon substrate 1 and an n-type epitaxial layer 2. The pn junction provides a photodiode function or a normal diode function depending on whether a light shield 13 is present over the pn junction or not. In the absence of the light shield 13, the pn junction serves as a photodiode. If the light shield 13 is present over the pn junction, it serves a diode. The upper surface of the pn junction is covered with a nitride film 4. When the pn junction serves as a photodiode, only the nitride film 4 is disposed on the upper surface of the pn junction to prevent an interference which would otherwise be caused by multiple reflections of applied light.

The light shield 13 comprises a first oxide film 5, a second oxide film 6, an interlayer nitride film 7, a second electrode 8, and a covering nitride film 9. The second electrode 8 prevents external light from reaching the pn junction.

A first electrode 12 has one end electrically connected to the n-type epitaxial layer 2 and an opposite end to an I/V converter 10.

The pn junction is electrically insulated from other pn junctions by p-type high-concentration layers.

Figure 8:
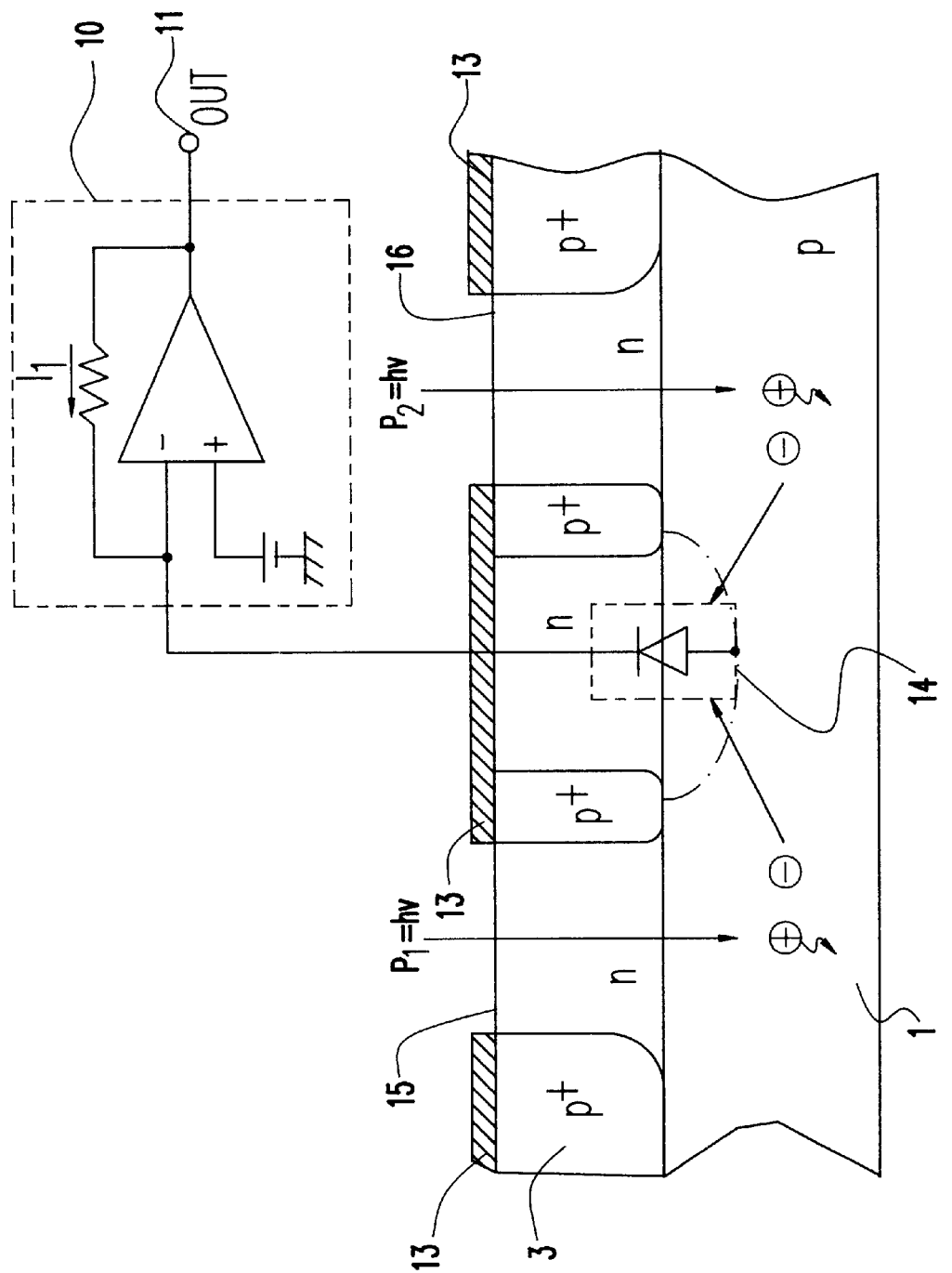
FIG. 8 is a fragmentary cross-sectional view, combined with a circuit diagram, illustrative of the manner in which the photodetector with a signal processing capability according to the first embodiment operates.

Operation of the photodetector with a signal processing capability according to the first embodiment will be described below with reference to FIG. 8.

(1) Adder:

When first incident light $P_1$ is applied from an input area 15, i.e., an area where there is no light shield 13 over the photodiode, electron and hole pairs are generated, and holes are absorbed by the p-type silicon substrate 1. Due to crosstalk characteristics, electrons are attracted by a depletion layer of a diode 14 and serve as a photocurrent $I_1$. The photocurrent $I_1$ is then converted by the I/V converter 10 into a voltage signal that is applied to an output terminal 11. The voltage signal is proportional to the incident light $P_1$.

When second incident light $P_2$ is applied from an input area 16, a photocurrent is similarly generated and converted by the I/V converter 10 into a voltage signal that is applied to the output terminal 11.

While the input areas 15, 16 are optically isolated from each other, they are electrically connected to each other by the diode 14 due to the crosstalk characteristics. Therefore, the photodetector operates as a two-input adder.

(2) Ternary circuit:

The photodetector is also operable as a ternary circuit if certain limitations are imposed on incident light. Specifically, if each of the incident light $P_1$ and the incident light $P_2$ has binary levels, i.e., an H level (larger intensity) and an L level (smaller intensity), then the voltage signal at the output terminal 11 can have three levels, i.e., an H level (larger voltage level), an M level (medium voltage level), and an L level (smaller voltage level), with respect to the H, L levels of the incident light $P_1$ and the incident light $P_2$, as shown in the following Table:

TABLE

| $P_1$ | $P_2$ | OUT |
|---|---|---|
| H | H | H |
| H | L | M |
| L | H | M |
| L | L | L |

Figure 9:
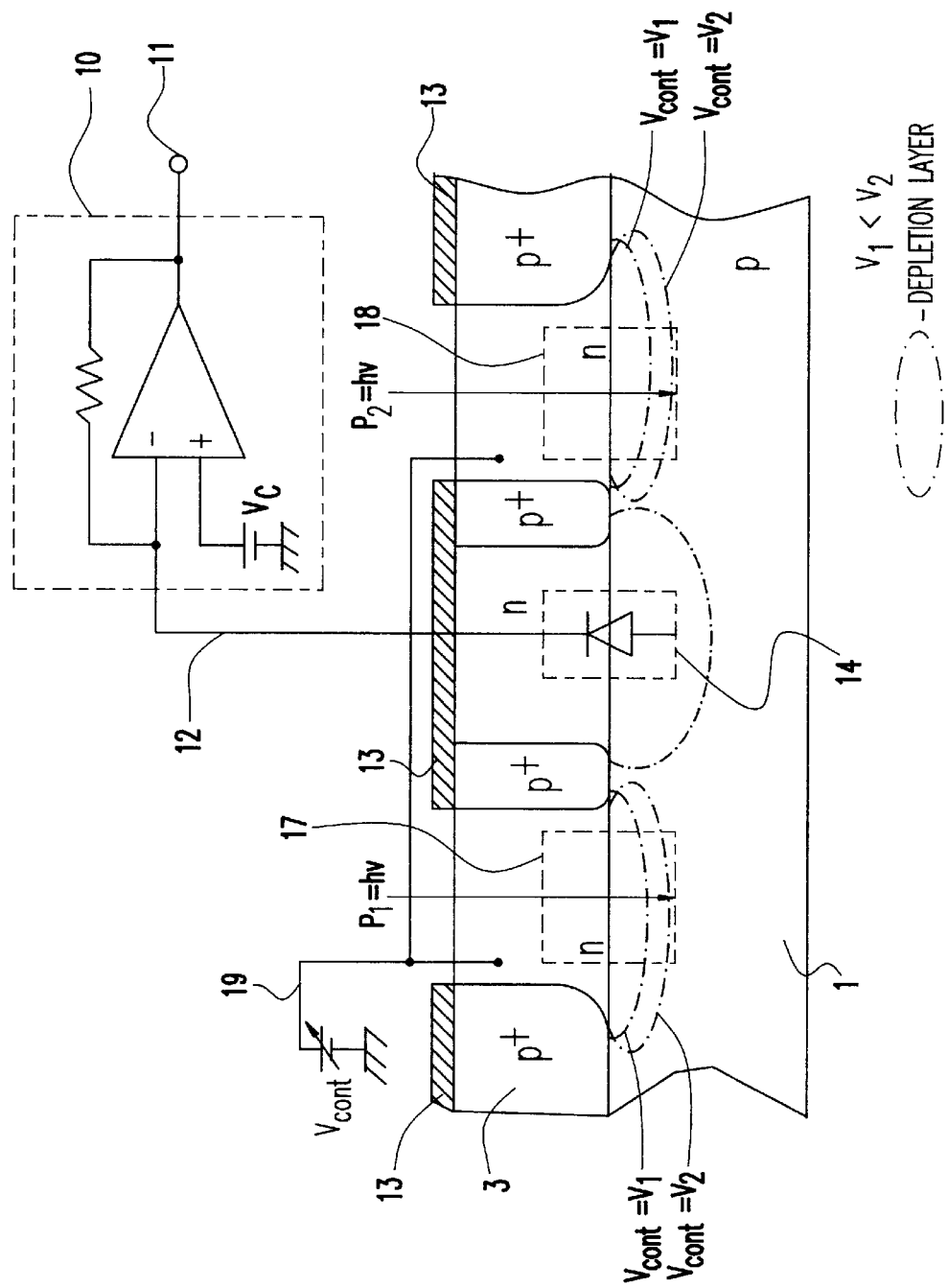
FIG. 9 is a fragmentary cross-sectional view, combined with a circuit diagram, of a photodetector with a signal processing capability according to a second embodiment of the present invention.

FIG. 9 shows a photodetector with a signal processing capability according to a second embodiment of the present invention. The photodetector serves as an automatic gain control (AGC) circuit. The photodetector according to the second embodiment differs from the photodetector according to the first embodiment in that a DC voltage $V_{cont}$ is applied to photodiodes 17, 18 to control the widths of depletion layers of the photodiodes 17, 18.

Operation of the photodetector is described in detail below. When the DC voltage $V_{cont}$ is relatively low ($V_{cont}=V_1$), the widths of the depletion layers of photodiodes 17 and 18 are smaller. Conversely, when the DC voltage $V_{cont}$ is relatively high ($V_{cont}=V_2$), the widths of the depletion layers of photodiodes 17 and 18 are larger.

As the widths of the depletion layers of photodiodes 17 and 18 become smaller, the probability that electrons of electron and hole pairs generated by the incident light $P_1$ and incident light $P_2$ will cause crosstalk increases. The photodetector shown in FIG. 9 thus provides a gain control capabiliy since the resulting voltage signal (gain) at output terminal 11 with respect to incident light $P_1$ and incident light $P_2$ is smaller when $V_{cont}=V_1$, and greater when $V_{cont}=V_2$.

While preferred embodiments of the present invention have been described using specific terms, such description is for illustrative purposes only, and it is to be understood that changes and variations may be made without departing from the spirit or scope of the following claims.

What is claimed is:

1. A photodetector having means for processing optical input signals, said means comprising:
    a p-type silicon substrate;
    an n-type epitaxial layer, portions of said n-type epitaxial layer and said p-type silicon substrate forming a pn junction;
    a light shield over said pn junction;
    first and second light input areas disposed on respective sides of said pn junction and said light shield; and
    an electrode having a first end electrically connected to the portions of said n-type epitaxial layer within said pn junction,
    wherein electrons in light passing into said first and second light input areas migrate to said pn junction, said pn junction outputting to said electrode a signal corresponding to a sum of a quantity of light passing into said first light input area and a quantity of light passing into said second light input area.

2. A photodetector according to claim 1, further comprising:
    a first dopant area separating said first light input area and said pn junction and a second dopant area separating said second light input area and said pn junction.

3. A photodetector according to claim 1 further comprising:
    at least means for controlling a width of a depletion layer of said pn junction.

4. A photodetector according to claim 1,
    wherein said signal is a current signal formed from a sum of a first current derived from the electrons migrating into said pn junction from said first light input area and a second current derived from the electrons migrating into said pn junction from said second light input area, and
    wherein a second end of said electrode is electrically connected to a current-to-voltage converter, said converter converting said current signal into a voltage signal.

5. A photodetector according to claim 4, wherein said current-to-voltage converter outputs three levels of voltage, said converter outputting a first level of voltage when the light passing into said first and second input areas are of low intensity, a second level of voltage when the light passing into one of said first and second input areas is of low intensity and light passing into the other of said first and second input areas is of high intensity, and a third level of voltage when the light passing into said first and second input areas are of high intensity.

6. A photodetector according to claim 1, wherein said first and second light input areas are formed from different portions of said n-type epitaxial layer and said p-type silicon substrate.

7. A photodetector according to claim 1, wherein a depletion layer of said pn junction attracts the electrons in said light passing into said first and second light input areas.

8. A photodetector according to claim 1, wherein said pn junction performs a normal diode function as a result of said light shield covering said pn junction.

9. A photodetector according to claim 1, wherein said pn junction performs a photodiode function when said light shield is removed.

10. A photodetector comprising:

a p-type silicon substrate;

an n-type epitaxial layer over said p-type silicon substrate;

a pn junction formed from adjacent portions of said n-type epitaxial layer and said p-type silicon substrate;

a light shield over said pn junction; and first and second photodiodes disposed on respective sides of said pn junction;

wherein electrons in light passing into said first and second photodiodes migrate to said pn junction, said pn junction outputting a signal corresponding to a sum of a quantity of light passing into said first photodiode and a quantity of light passing into said second photodiode.

11. A photodetector according to claim 10, further comprising:

a first dopant area separating said first photodiode and said pn junction and a second dopant area separating said photodiode and said pn junction.

12. A photodetector according to claim 10, further comprising:

a first electrode having one end connected to said pn junction;

a current-to-voltage converter connected to another end of said first electrode, wherein said signal is a current signal formed from a sum of a first current derived from the electrons migrating into said pn junction from said first photodiode and a second current derived from the electrons migrating into said pn junction from said second photodiode, said converter converting said current signal into a voltage signal.

13. A photodetector according to claim 12, wherein said current-to-voltage converter outputs three levels of voltage, said converter outputting a first level of voltage when the light passing into said first and second photodiodes are of low intensity, a second level of voltage when the light passing into one of said first and second photodiodes is of low intensity and light passing into the other of said first and second photodiodes is of high intensity, and a third level of voltage when the light passing into said first and second photodiodes are of high intensity.

14. A photodetector according to claim 12, further comprising:

means for inputting DC voltage signals of different levels into said first and second photodiodes to control a gain of said photodetector.

15. A photodetector according to claim 14, wherein said photodetector has a first gain when said means inputs a DC voltage signal of a first level into said first and second photodiodes, and wherein said photodetector has a second gain when said means inputs a DC voltage signal of a second level into said first and second photodiodes, said second gain and said second level higher than said first gain and said first level, respectively.

16. A photodetector according to claim 12, wherein said first and second photodiodes are formed from different adjacent portions of said n-type epitaxial layer and said p-type silicon substrate.

17. A photodetector according to claim 16, further comprising:

means for controlling widths of depletions layers of said first and second photodiodes, to thereby control a gain of said photodetector.

* * * * *